(12) United States Patent
Ryum et al.

(10) Patent No.: US 6,337,494 B1
(45) Date of Patent: *Jan. 8, 2002

(54) SUPER SELF-ALIGNED BIPOLAR TRANSISTOR AND METHOD FOR FABRICATING THEREOF

(75) Inventors: Byung Ryul Ryum; Deok Ho Cho; Tae Hyeon Han; Soo Min Lee, all of Daejeon (KR)

(73) Assignee: Electronics and Telecommunications Research Institute, Daejeon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/137,709

(22) Filed: Aug. 21, 1998

(30) Foreign Application Priority Data

Sep. 23, 1997 (KR) .............................................. 97-48320

(51) Int. Cl.⁷ .......................................... H01L 31/0328
(52) U.S. Cl. ........................ 257/197; 257/511; 257/616
(58) Field of Search ................................ 257/511, 198, 257/616, 786, 197; 438/235, 309, 312, 317, 207

(56) References Cited

U.S. PATENT DOCUMENTS

| 4,849,371 A | | 7/1989 | Hansen et al. ............... 438/348 |
| 4,851,362 A | | 7/1989 | Suzuki ....................... 438/348 |
| 5,177,025 A | | 1/1993 | Turner et al. ................ 438/309 |
| 5,484,737 A | * | 1/1996 | Ryum et al. ................. 438/318 |
| 5,496,745 A | * | 3/1996 | Ryum et al. ................. 438/359 |
| 5,541,120 A | * | 7/1996 | Robinson et al. ............ 257/511 |
| 5,696,007 A | * | 12/1997 | Ryum et al. ................. 438/320 |
| 5,962,879 A | * | 10/1999 | Ryum et al. ................. 257/198 |
| 6,124,614 A | * | 9/2000 | Ryum ......................... 257/347 |

FOREIGN PATENT DOCUMENTS

EP 0 430279 A2 6/1991

\* cited by examiner

Primary Examiner—Olik Chaudhuri
Assistant Examiner—Nathan W. Ha
(74) Attorney, Agent, or Firm—Jacobson Holman, PLLC

(57) ABSTRACT

Disclosed is a super self-aligned heterojunction bipolar transistor which is capable of miniaturizing an element, simplifying the process step thereof without using a trench isolation process and a sophisticated selective epitaxial growth (SEG) processes. According to this invention, the sophisticated isolation and the SEG techniques are derived by using simple and popular processes. The base layer has multi-layer structure being made of a Si, an undoped SiGe, a SiGe doped a p-type impurity in-situ and Si. Also, the selective epitaxial growth is not required. Thus, it can be less prone to a flow of leakage current or an emitter-base-collector short effect.

8 Claims, 13 Drawing Sheets

SUPER SELF-ALIGNED BIPOLAR TRANSISTOR AND METHOD FOR FABRICATING THEREOF

BACKGROUND OF THE INVENTION

1. Field of the Invention

The present invention relates to a super self-aligned heterojunction bipolar transistor and method for manufacturing thereof using a Si/SiGe heterojunction base layer.

2. Description of Prior Art

In general, even if the prior art element has an improved operating speed in proportion to miniaturization of a homojunction bipolar transistor, since, to accomplish this, impurity concentration between emitter and base are increased, enhancement of characteristics thereof based on a structure of such element is a difficult task. A heterojunction bipolar transistor to cope with the above disadvantage has been proposed.

Such a heterojunction bipolar transistor has a characteristic that energy bandgap of an emitter is larger than that of a base. For this reason, utilization of the heterojunction bipolar transistor showed an improvement in the performance of the element and various design effects in comparison to the homojunction bipolar transistor. In addition, in the manufacturing process associated with the homojunction bipolar transistor previously described, a method of decreasing the energy bandgap by adding germanium to a base layer composed of silicon has been developed.

As a conventional homojunction silicon bipolar transistor, the prior art heterojunction bipolar transistors utilize a polysilicon thin film as both a base electrode and an impurity diffusion source for the emitter. Thus, using Ge instead of Si on the base layer, a difference between an energy bandgap of the emitter and that of the base is incurred to increase emitter implantation efficiency, then the base is grown to a high doping concentration ultra-thin film, thereby enhancing a current gain and a switching speed of element.

Recently, in order to optimize and miniaturize the structure of the element, various methods have been used to minimize several parasitic components such as a base resistance at an active region of the element and parasitic capacity between a collector and a base.

Examples of such various methods include a trench isolation, a local oxidation of silicon ("LOCOS"), a selective epitaxial growth("SEG") of a SiGe thin film, and a selective epitaxial growth of a Si emitter and so on.

Using the above methods, a super self-aligned Si/SiGe heterojunction bipolar transistor is being developed, which is self-aligned between base and emitter to reduce a base parasitic resistance, or self-aligned both between base and emitter, and between collector and base.

The LOCOS has a disadvantage in that since a bird's beak is horizontally formed as much as the thickness of silicon thermal oxidation film which is vertically formed, there is a limit in geometrically reducing the transistor.

There are shown in FIG. 1 an exemplary super self-aligned Si/SiGe heterojunction bipolar transistor which is directed to using the SEG method without using the LOCOS method.

Referring now to FIG. 1, an n+ buried silicon collector layer (1-2), which has a high doping concentration, is first formed on a p-type silicon substrate (1-1), and an n– silicon collector layer (1-3), which has a low doping concentration, is then grown on the buried collector layer (1-2).

Subsequently, a collector junction portion (1-4) is formed by implanting an n-type impurity ion thereon, and then a trench to isolate between elements is formed by a dry etching method, and, in turn, filling therein with Boron Phosphorous Silica Glass("BPSG") insulating thin film (1-5) made of boron and phosphorous. The BPSG insulating thin film (1-5) is then flattened under a high pressure.

In an ensuing step, an insulating film (1-6), a P+ polysilicon film (1-7), an insulating film (1-8) and a side-wall insulating film (1-9) are formed by depositing and etching methods as shown in FIG. 1, and an n-type collector region (1-10) for enhancing characteristics of elements in a high current region is then formed by selective ion implantation to only an active region of the element.

In a subsequent step, a SiGe base layer (1-11) is selectively grown on only an exposed portion in the collector region (1-10) and the polysilicon film (1-7), through the use of gas source molecular beam technique, and then a polysilicon film (1-12) is selectively grown on the remaining space, thereby accomplishing a junction between the polysilicon film (1-7) for a base electrode and the SiGe base layer (1-11).

Accordingly, self-alignment between the collector and the base can be performed, since a parasitic capacity region formed between the collector and the base is not defined as a photoresist and is limited only to a portion of a polysilicon thin film (1-12).

Since, however, the parasitic capacity region defined by the polysilicon thin film (1-12) is determined from a horizontal wet etching for the insulating film (1-6), resulting in the degradation of efficiency of process in terms of uniformity and reproduction aspects, thus entailing the fatal degradation of the performance of element.

In addition, the prior art method has a disadvantage that since the low speed selective epitaxial growth method is applied two times during the growth of the SiGe base layer (1-11) and the polysilicon thin film (1-12), and two thin films for example, the SiGe base (1-11) and the polysilicon (1-12), are used during the growth process thereof, resulting in a complicated manufacturing process, and further even if the polysilicon thin film (1-12) is slightly grown on the base layer (1-11), it is possible to cause the fatal degradation of element performance, thereby making it difficult to control the process thereof. Thus, with the prior art method it is difficult to accomplish an effective manufacturing process and a simplified processing step.

Furthermore, as shown in FIG. 1, the prior art method has a shortcoming in that a trench structure for isolating between elements should be deeply formed so as to prevent the collector junction portion (1-4) from contacting between elements via the n– collector thin film (1-3) on the n+ buried Si collector layer (1-2) formed at the entire surface of a substrate, resulting in a larger space requirement to be filled with the insulating thin film (1-5), thus entailing a bulkier element.

Turning now to FIG. 2, there is presented a cross-sectional view of a Si/SiGe heterojunction bipolar element manufactured by another method previously described, after the growth of a base thin film. In the prior art exemplary shown in FIG. 2, both of the base and the collector thin films are grown through the use of the SEG method in contrast with the trench structure previously described, to thereby accomplish a simplified and an integrated manufacturing process.

As shown in FIG. 2, an n+-type collector (2-2) is first formed on a p-type substrate (2-1), and then an insulating thin film (2-3) and a polysilicon thin film (2-4) for a base electrode are sequentially deposited thereon. Thereafter, a base electrode region is defined by a photoresist mask and etching of the polysilicon thin film (2-4).

After the above step, an insulating thin film (2-5) is deposited thereon, and then the photoresist mask, the insulating thin film (2-5), the polysilicon thin film (2-4) and the insulating thin film (2-3) are defined as an active region by etching process.

Subsequently, an n-type silicon layer (2-6) for a collector, a SiGe layer (2-7) for a base, and a silicon layer (2-8) for an emitter are sequentially grown through the application of impurity thereon.

During the growth of the layers, (2-6), (2-7), and (2-8), as shown in FIG. 2, a polycrystalline or an amorphous silicon thin films, (2-6-1), (2-7-1) and (2-8-1), are formed at each side thereof, respectively. Thereafter, a silicide thin film (2-9) for a collector metal junction is formed, and a metal electrode (2-10) is then deposited to thereby obtain an element.

However, the above element suffers from a drawback that since if a current path passes via a sequence of the amorphous silicon thin films, (2-8-1), (2-7-1) and (2-6-1), it can be prone to a short between the collector and the emitter. Likewise, current paths passing through a sequence of the amorphous silicon thin films, (2-8-1), (2-7-1), (2-6-1) and the n-type Si thin film (2-6), or a series of the thin film (2-6), the thin films, (2-7-1) and (2-6-1) may occur, in practice thereby causing an emitter-base and a base-collector short.

In addition, when the collector, the base and the emitter layer (2-6, 2-7 and 2-8)) is selectively growing, since the thin films (2-6-1, 2-7-1 and 2-8-1) are laterally formed respectively, the active region defined by a single-crystalline silicon layer is not clearly defined.

SUMMARY OF THE INVENTION

It is, therefore, a primary object of the present invention to provide a super self-aligned bipolar transistor and a method for manufacturing thereof which is capable of miniaturizing the size of an element, and simplifying the fabrication process without designing a trench for isolating between elements, thereby enhancing the performance thereof.

In accordance with the present invention, there is provided a super self-aligned heterojunction bipolar transistor, which comprise a semiconductor substrate having a buried collector; a first insulating film, a second insulating film and a conducting layer for a base electrode sequentially formed on the substrate, the first insulating film being formed at both sides of the second insulating film and the conducting layer; a collector surrounded by the first and the second insulating films and the conducting layer, and formed on the buried collector in an active region of the transistor defined by patterning the conducting layer and the first and the second insulating films; a multi-layer intrinsic base formed on the collector, and a multi-layer extrinsic base formed on the conducting layer and the first insulating film of the sidewall; an emitter formed on the intrinsic base; a first spacer formed at both sides of the emitter, and a second spacer formed on the first spacer and formed at both sidewalls of the emitter; a metallic base electrode formed on the extrinsic base and a metalic emitter electrode formed on the emitter; a passivation insulating layer formed on an entire surface of the above semi-finished structure; and metallic interconnections formed on the base electrode, the emitter electrode, and the buried collector, passing through the passivation insulating layer, and/or the first and the second insulating film, respectively.

In accordance with the present invention, there is provided a method for manufacturing a super self-aligned heterojunction bipolar transistor, which comprises the steps of:

(a) growing a collector film on an entire surface of a semiconductor substrate having a buried collector; (b) sequentially forming a plurality of masking layers on the collector film, and patterning the masking layers and the collector film using a photoresist pattern for defining an active region as a mask; (c) forming a first insulating film to coat the exposed substrate and at both sidewalls of the collector; (d) forming a second insulating film on the first insulating film; (e) forming a conducting layer for base electrode on the second insulating film such that its height is equal to the collector; (f) depositing a multi-layer base to form simultaneously an intrinsic base on said collector and an extrinsic base on said conducting layer; (g) forming a third insulating film, and opening an emitter region by etching the third insulating film; (h) depositing an emitter on the exposed intrinsic base and on a portion of the third insulating film; (i) forming a spacer at both sidewalls of the emitter and on the third insulating film; (j) forming a metallic silicide on the emitter and on the extrinsic base; and (k) depositing a passivation insulator, opening contact windows to contact the emitter silicide, the base silicide and the buried collector, and performing a metal wiring process.

Preferably, the semiconductor substrate is composed of a single silicon substrate, a heterojunction substrate being made of Si/SiGe/Ge, or a heterojunction substrate being made of Si/diamond/ Si.

Preferably, the plurality of masking layers are composed of a pad oxide, a first masking layer and a second masking layer, in which the etching rates of the masking layers are different from each other. Also, the first masking layer is a silicon nitride and the second masking layer is a polysilicon.

Preferably, the first insulating film, used as a spacer of the collector, is a thermal oxide formed by thermal oxidation of the exposed substrate.

In addition, the step of (d) may further comprise: (d1) overcoating the second insulating film; (d2) chemical-mechanically polishing the overcoated second insulating film using the second masking layer as a polishing stopper; and (d3) etching the overcoated portion of the second insulating film.

More preferably, the step of (e) further comprises: (e1) overcoating the conducting layer; (e2) first chemical-mechanically polishing the overcoated conducting layer using the second masking layer as a stopper; (e3) second etching the conducting layer using the first masking layer as an etching stopper; and (e4) third etching the conducting layer using the pad oxide as an etching stopper.

Preferably, the conducting layer for the base electrode is a $P^+$-type polysilicon, a poly-SiGe, or a poly-Ge which is doped by either an in-situ doping or a dopant implantation. Also, the multi-layer base is comprised of a Si/undoped SiGe/doped SiGe/Si heterojunction structure, to thereby prevent the degradation of the performance of the element due to the occurrence of a parasitic electric potential.

Before depositing the passivation insulating film of the (k) step, the method may further comprise the step of removing the remaining collector films to expose the surface of the substrate, to thereby decrease a transmission loss of transistor.

Also, before depositing the passivation insulating film of the (k) step, the method may further comprise the step of forming a collector sinker by implanting dopants into a portion of remaining collector films in order to directly connect with the collector wire, thereby decreasing the step-coverage of the metal wire.

BRIEF DESCRIPTION OF THE DRAWINGS

The above and other objects and features of the present invention will become apparent from the following description of preferred embodiments, when taken in conjunction with the accompanying drawings, in which.

DETAILED DESCRIPTION OF THE PREFERRED EMBODIMENTS

Figure 3:
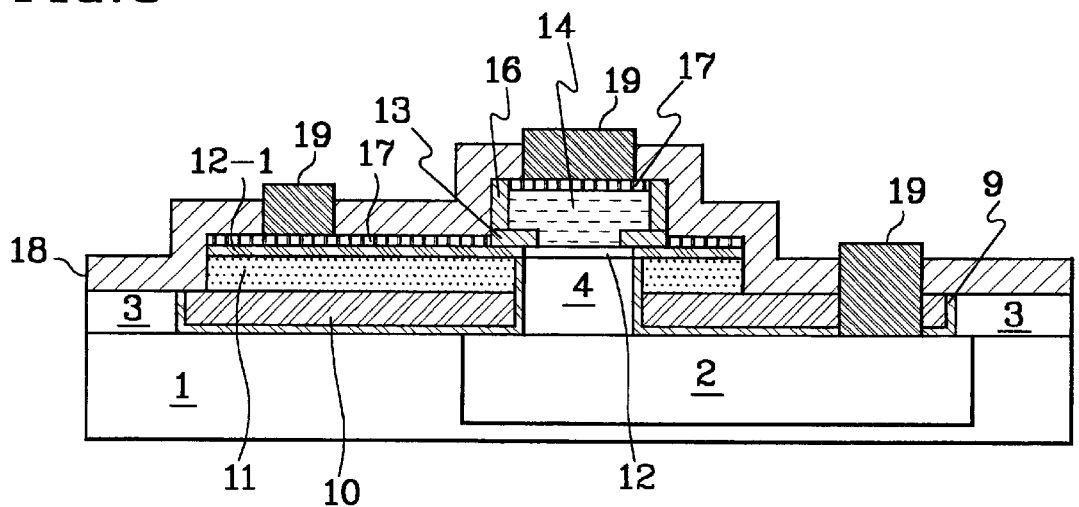
FIG. 3 explains a cross-sectional view of a super self-aligned bipolar transistor manufactured in accordance with a preferred embodiment of the present invention.

FIG. 3 provides a cross-sectional view of a super self-aligned bipolar transistor in accordance with a preferred embodiment of the present invention.

Referring to FIG. 3, a buried collector 2 is first formed on a semiconductor substrate 1, and then a first insulating film 9, a second insulating film 10 and a conducting thin film 11 for a base electrode are sequentially formed thereon. At this time, a portion of the first insulating film 9 is formed at both sides of the second insulating film 10 and the conducting layer 11.

Meanwhile, the semiconductor substrate 1 is preferably composed of single silicon substrate, a heterojunction substrate being made of Si/SiGe/Ge, or a heterojunction substrate being made of Si/diamond/Si or Ge. Also, the above conducting thin film 11 is generally made of a polysilicon of high concentration, a poly-SiGe, or a poly-Ge which is doped by either an in-situ doping or a dopant implantation.

Then, a collector layer 4 such as a single-crystalline silicon or a germanium is formed on the buried collector 2 in an active region of the transistor defined by patterning the conducting layer 11 and the first and the second insulating films, 10 and 9, respectively. Also, the collector layer 4 is surrounded by the first and the second insulating films 9, 10 and the conducting layer 11. A multi-layer intrinsic base 12 is formed on the collector layer 4, and a multi-layer extrinsic base 12-1 is formed on the conducting layer 11 and the first insulating film 9 of the sidewall. Preferably, the multi-layer intrinsic and extrinsic base 12 and 12-1 are formed by a double layer consisting of Si/SiGe, or more preferably, comprised of a Si/undoped SiGe/doped SiGe/Si heterojunction structure.

An emitter layer 14 is formed on the intrinsic base 12. A third insulating film 13 is formed at both sides of the emitter layer 14, and a spacer 16 is formed on the third insulating film 13 and at both sidewalls of the emitter 14, for isolating the emitter layer 14 from the conducting layer 11. On the extrinsic base 12-1, a metallic base electrode 17 is formed, and a metalic emitter electrode 17 is formed on the emitter layer 14.

On the above resulting structure, a passivation insulating layer 18 is deposited, and then metallic interconnections 19 are formed on the metallic base/emitter electrodes 17 and the buried collector 2 passing through the passivation insulating layer 18 and/or the first and second insulating layers 9 and 10.

In comparison with the conventional arts (see, FIGS. 1 and 2), details of the advantages of the present invention will be described in detail below with reference to FIG. 3.

Figure 1:
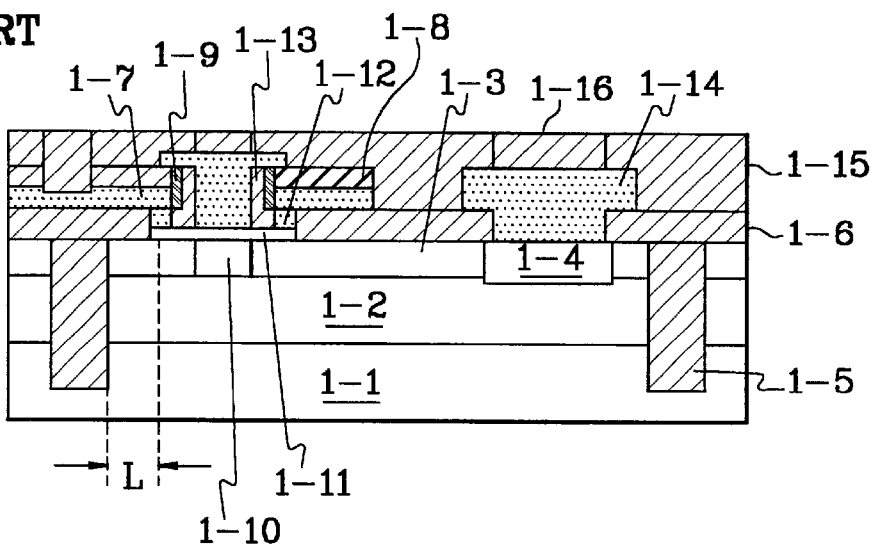
FIG. 1 shows a cross-sectional view of a super self-aligned npn Si/SiGe heterojunction bipolar transistor which utilizes the selective base epitaxial growth method previously described.

First, in the conventional art, a trench structure should be deeply formed to isolate the elements so as to prevent the collector junction portion (1-4) from contacting with elements through the n$^-$ Si collector layer (1-3), in the n$^+$ buried Si collector layer (1-2) deposited on the entire surface of the substrate, as shown in FIG. 1. As a result, a plane area for filling with the BPSG insulating thin film (1-5) is increased to thereby entail a bulkier element.

On the other hand, since each of the collector thin films 4 is isolated from the others by the aid of the insulating thin film 9 and 10, as shown in FIG. 3, in the present invention it is unnecessary to use the sophisticated trench isolation process. Likewise, since each of the self-alignments of base-collector and emitter-base are performed so that all of the emitter, the base and the collector has the same area relative to each other, it is possible to switch upward/downward operating modes, thereby making it possible to reduce a parasitic capacity between the base and the collector, and to self-align between the emitter and the base. Thus, removing the need for a process to isolate the elements results in a smaller element and a further simplified process step.

Figure 2:
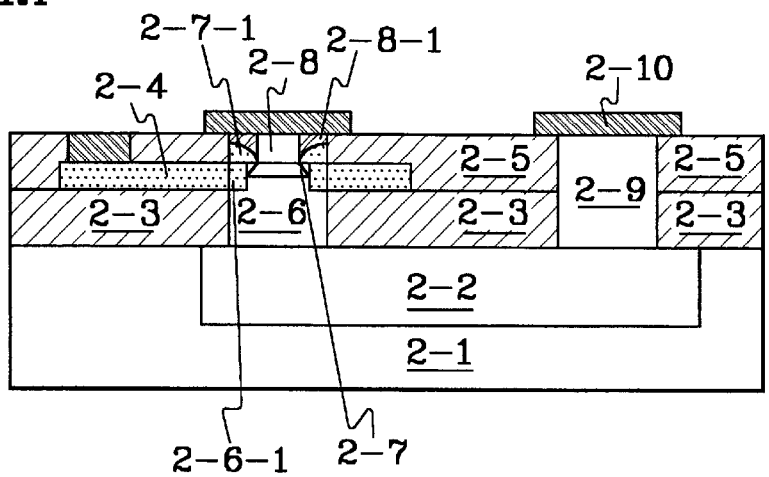
FIG. 2 offers a cross-sectional view of a heterojunction bipolar transistor which is self-aligned between collector and base by using another method previously described.

Second, in FIGS. 2 and 3, a useless region in FIG. 1 (which is indicated by length L) is eliminated to miniaturize a size of the element, resulting in a possibility of high integration and a reduction of parasitic capacity caused between an n$^+$ buried collector and a p-type substrate, thereby making it possible to enhance an operating speed of the element.

On the other hand, in comparison with the element shown in FIG. 2, merits of the element shown in FIG. 3 will be discussed below.

First, in the case of the element presented in FIG. 2, since a current path passes via a sequence of the amorphous silicon thin films, (2-8-1), (2-7-1) and (2-6-1), it can be prone to a collector -emitter short effect not related to a leakage of current. Similarly, since a current path passes through a sequence of the amorphous silicon thin films, (2-8-1), (2-7-1), (2-6-1) and the n-type silicon thin film (2-6), or a series of the n-type silicon thin films, (2-6), (2-7-1) and (2-6-1), an emitter-base and a basecollector short effects may occur. In consequence, in practice the element associated with the structure shown in FIG. 2 is difficult to accomplish.

Furthermore, when the n-type silicon thin film (2-6), i.e., collector thin film, is selectively grown, since the thin film (2-6-1) is grown from sides of the collector thin film (2-6), the thicker the thickness of the collector thin film (2-6) is, the greater the growth of the thin film (2-6-1) in the sides thereof. As a result, a sequence of simple-crystal thin films, (2-8), (2-7), (2-6) and (2-2), to be defined as an active region in the element may not be clearly determined. In addition to the growth of both of the SiGe thin film (2-7) and the silicon thin film (2-8), since the thin films, (2-7-1) and (2-8-1), are also grown, a width of the active region in the element depends on a thickness of a sequence of the thin films, (2-6), (2-7) and (2-8).

In contrast to the element disclosed previously, the present invention prevents a poly-crystalline thin film from growing between the polysilicon conducting film 11 and the collector layer 4, thereby making it possible to clearly define the active region in the element as defined by a mask. Also, isolation between an emitter layer 14 and the conductiong layers is derived by using a mask defining an emitter region and spacers 13 and 16. Thus, the present invention is less prone to a flow of leakage current or an emitter-base-collector short effect.

Second, when a single p-type SiGe thin film is used as a base as shown in FIG. 2, a p-type impurity within the base thin film, during the growth of the emitter layer (2-8), may be diffused to the collector and the emitter adjacent to the base, respectively. Thus, discordance between a junction face of a sequence of the emitter thin film (2-8), the SiGe base thin film (2-7) and the n-type silicon collector thin film (2-6), i.e., a sequence of emitter-base-collector, and a junction face by the npn impurity is incurred. As a result, a parasitic electric potential is created at the junction faces between the emitter-the base and between the collector-the base, hence, the parasitic electric potential prevents an electron from transferring from the emitter to the collector, thereby causing degraded performance factors of the element such as a current amplification factor and a cutoff frequency and so on.

Conversely, in the present invention, in order to overcome the degradation of performance factors arising from generation of such parasitic electric potential, the base layer 12 and 12-1 have a multi-layer structure being made of a Si, an undoped SiGe, a SiGe doped a p-type impurity in-situ and Si.

Third, in the prior art element, since a thickness of the collector thin film in a high speed element is thinly designed, a thickness of the base electrode film (2-4) in FIG. 2 is thin so that a parasitic resistance resulting from the base electrode film (2-4) is further increased. The present invention, by contrast, provides a silide layers 17 to minimize the parasitic resistance as shown in FIG. 3.

Fourth, in order to achieve a high speed element when a thickness of the collector thin film (2-6) is decreased, the thickness of the insulating thin film (2-3) is also decreased, thus entailing a reduction of breakdown voltages between the thin film (2-4) and the thin film (2-6-1) and between the thin film (2-4) and the collector thin film (2-6). In accordance with the present invention, even though a thickness of the collector layer 4 is decreased depending on the insulating films 9 and 10, the breakdown voltage between the conduction layer 11 and the collector layer 4 is not decreased.

Fifth, in the structure shown in FIG. 2, since a selective epitaxial growth process to grow the SiGe thin film (2-7) is used, it is difficult to manufacture and has cumbersome processes, thereby degrading overall productivity. In addition, the prior art structure causes an increase of parasitic resistance owing to a junction between the base electrode (2-4) and the base thin film (2-7) being performed at the sides thereof.

In accordance with the present invention, the selective epitaxial growth for the intrinsic and extrinsic base 12 and 12-1 is not required since all surfaces underlying the base are made of silicon, thereby preventing a loading effect causing the degradation of transistor and preventing an increase in the parasitic resistance in the base regions.

Hereinafter, the manufacturing method of a super self-aligned bipolar transistor in accordance with the present invention will be described in detail.

Figure 4A:
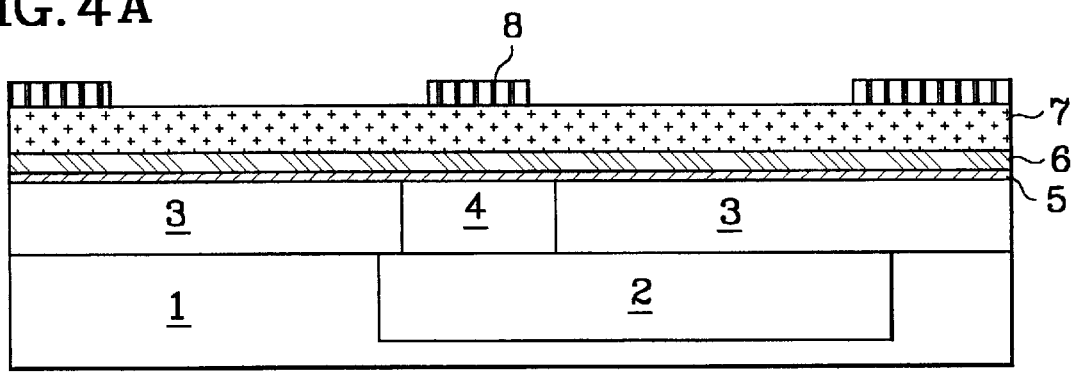
FIGS. 4(A) to 4(P) exhibit schematic cross-sectional views setting forth the manufacturing steps for the super self-aligned bipolar transistor in accordance with one preferred embodiment of the present invention.
Figure 4B:
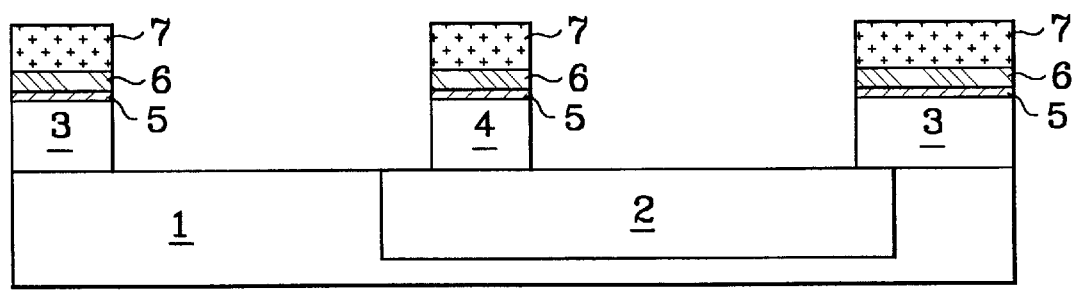
Figure 4C:
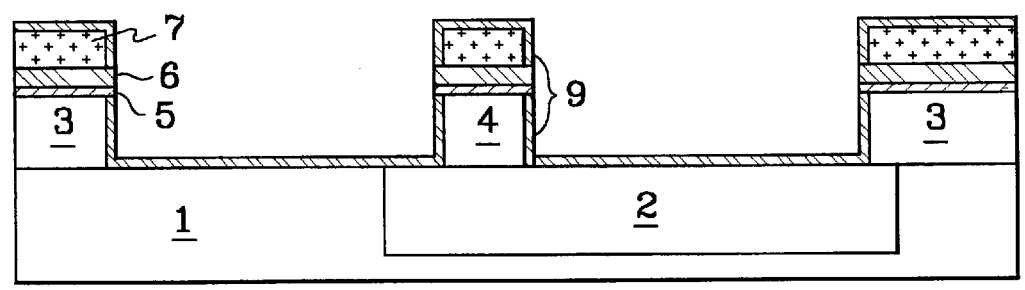
Figure 4D:
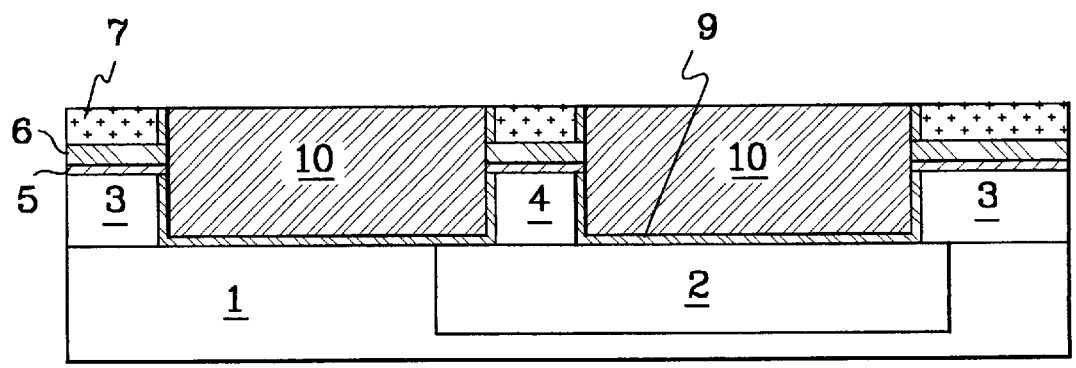
Figure 4E:
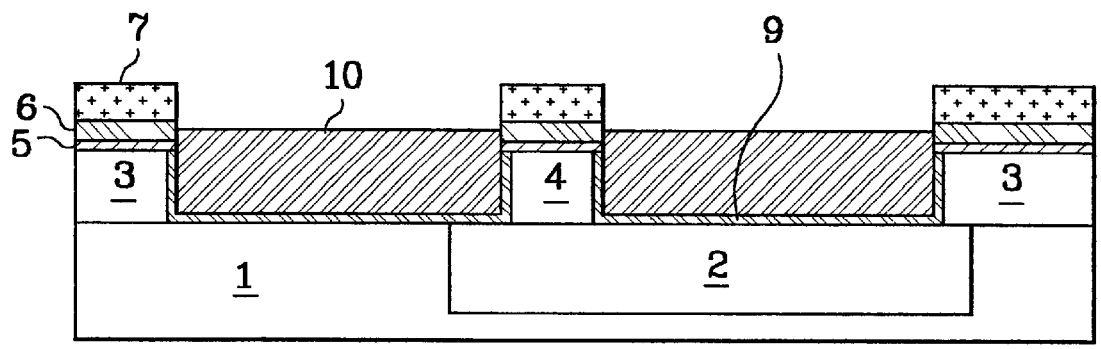
Figure 4F:
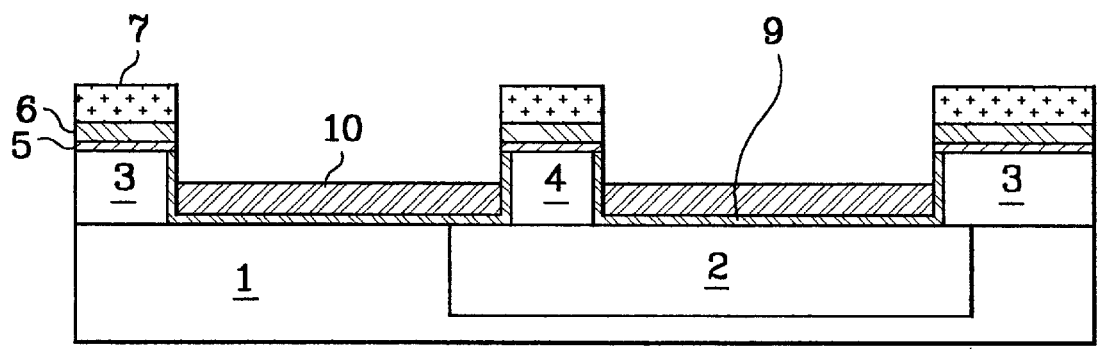
Figure 4G:
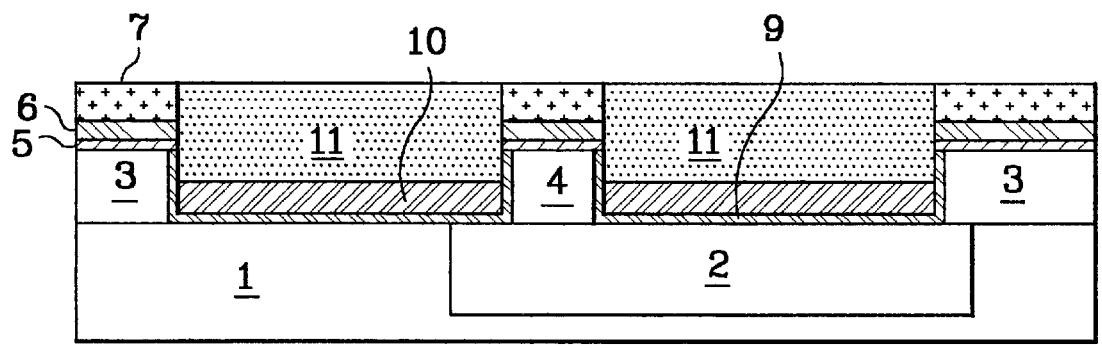
Figure 4H:
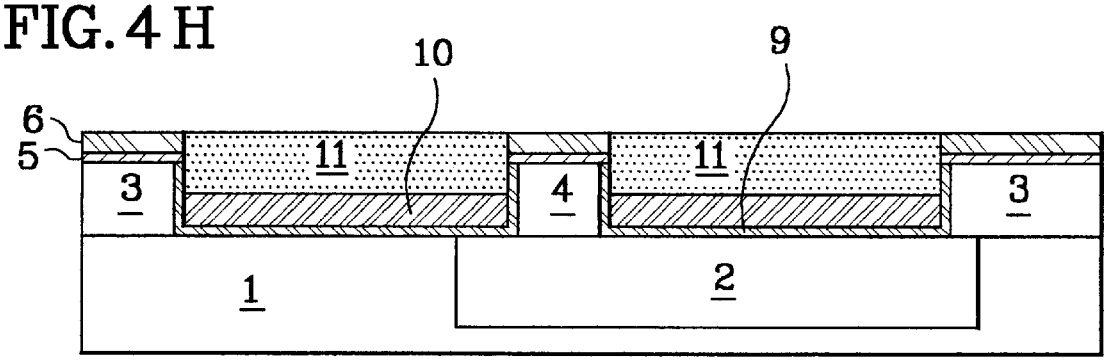
Figure 4:
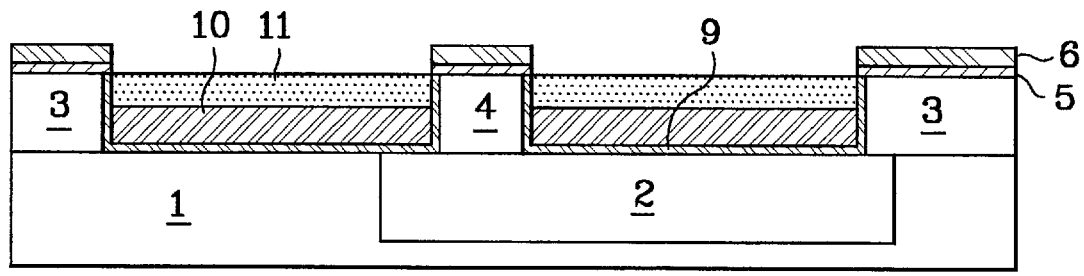
Figure 4:
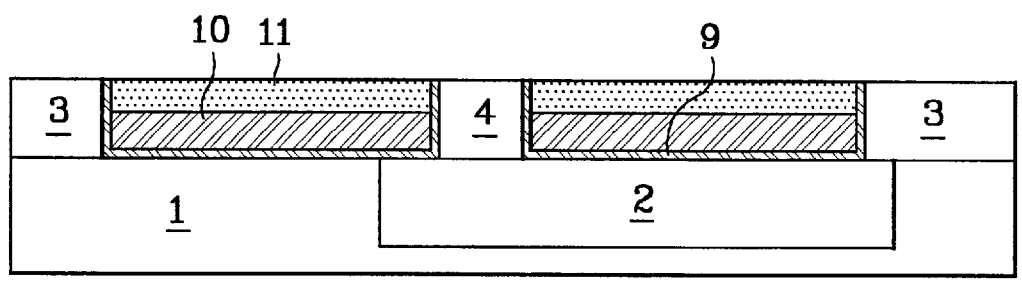
Figure 4:
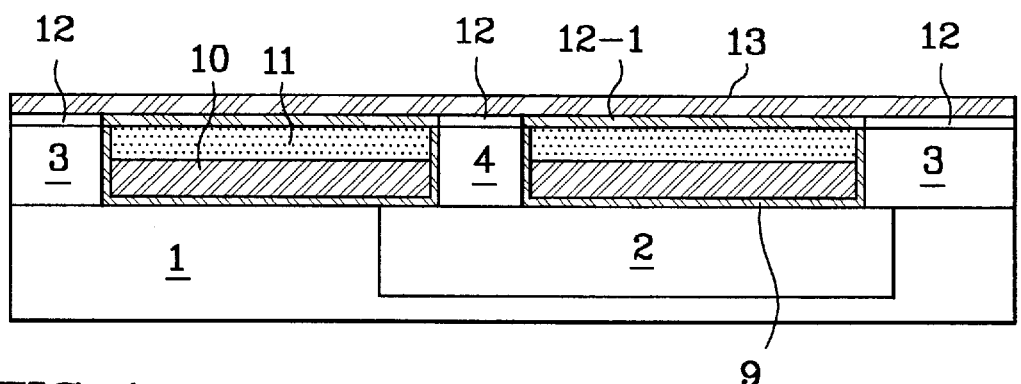
Figure 4:
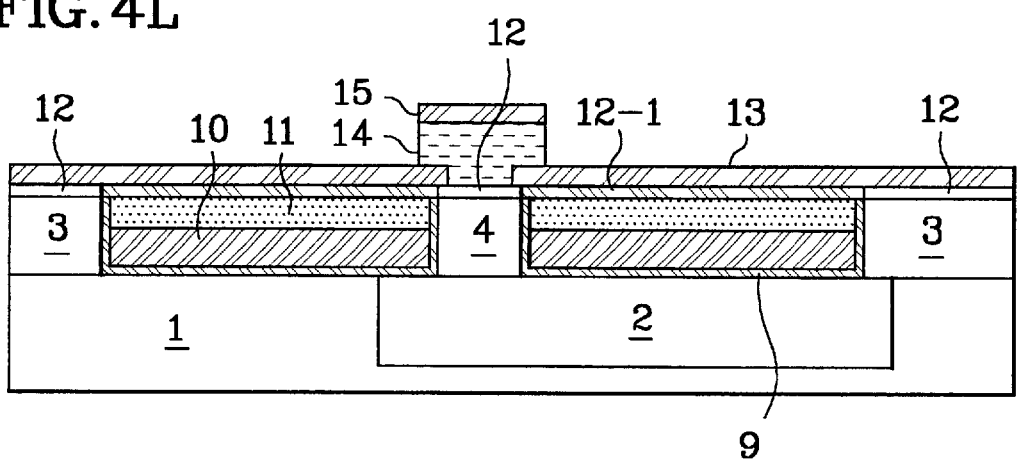
Figure 4M:
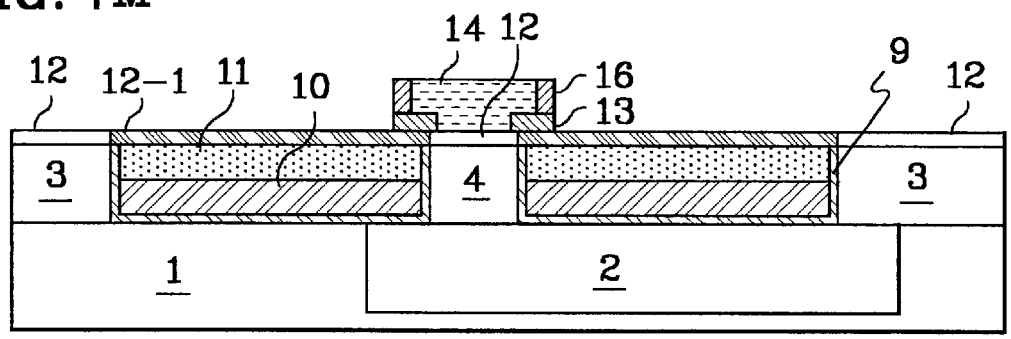
Figure 4N:
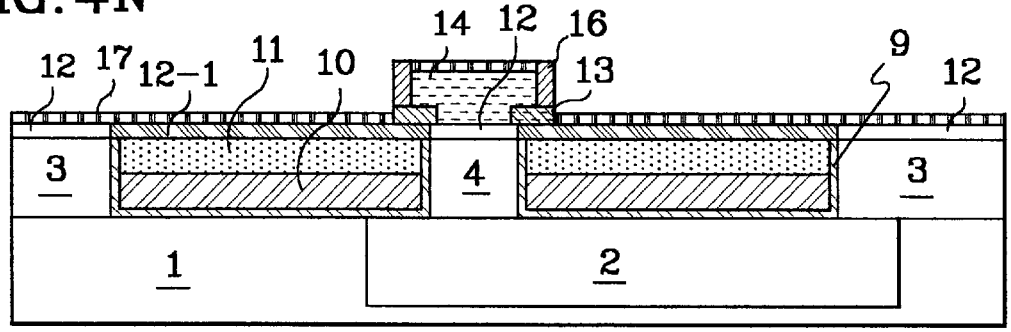
Figure 4O:
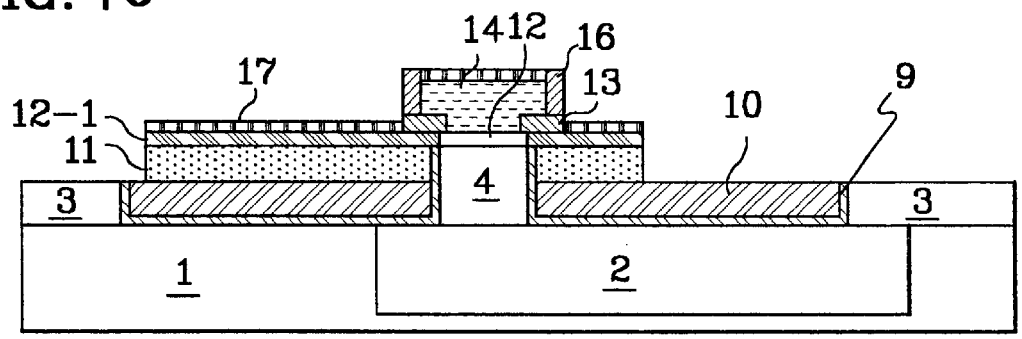
Figure 4P:
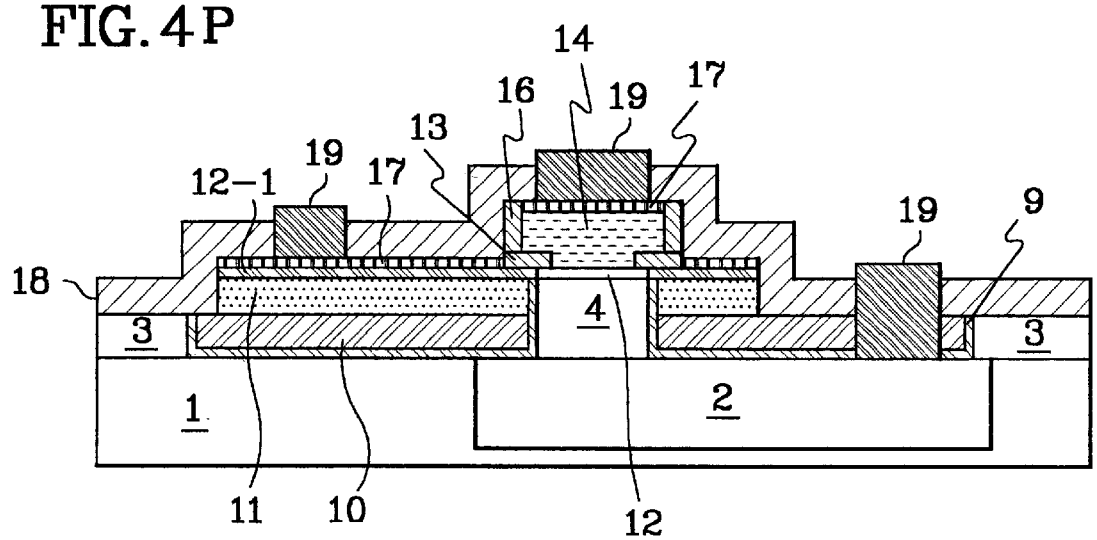

FIGS. 4(A) to 4(P) show schematic cross-sectional views setting forth the manufacturing steps for super self-aligned bipolar transistors according to a first embodiment of this invention.

Referring to FIG. 4 (A), there are shown a p-type semiconductor substrate 1 having a buried collector 2. The semiconductor substrate 1 is preferably composed of a single silicon substrate as shown in FIG. 4 (A). Also, the substrate can be composed of a heterojunction substrate being made of Si/SiGe/Ge, or being made of Si/diamond thin film/Si. The above buried collector 2 is generally formed by photolithography, ion implantation and annealing process.

Next, on the entire surface of the substrate 1, a collector thin film 3 is grown. Then, a collector region 4 is formed by selectively implanting n-type dopants into the portion of the collector thin film 3. Sequentially, a plurality of masking layers are formed on the resultant structure. At this time, the plurality of masking layers are composed of a pad oxide layer 5, a first making layer 6 and a second masking layer 7, in which an etching rate of each masking layer is different from that of the other masking layers to use an etching stopper. That is, the first masking layer 6 uses a silicon nitride and the second masking layer 7 is a polysilicon film.

Turning now to FIG. 4(B), the masking layers 5, 6 and 7 and the collector films 3 and 4 are sequentially etched by using a photoresist pattern 8 for defining an active region of transistors as a mask, and then the photoresist mask 8 is removed.

Referring to FIG. 4(C), a first insulating film 9 such as a thermal oxide is formed on the resultant structure so as to coat the exposed substrate and both sidewalls of the collector film 3 and 4. The first insulating film 9 used as a spacer of the collector is grown by thermal oxidation process of the exposed substrate 1 and collector thin film 3 and 4.

FIGS. 4(D) to 4(F) illustrate steps of forming a second insulating film 10 on the first insulating film 9. The formation steps of the second insulating film 10 comprise overcoating the second insulating film 10; chemically-mechanically polishing the overcoated second insulating film 10 using the polysilicon masking layer 7 as a polishing stopper, as shown in FIG. 4(D), and etching the overcoated portion of the second insulating film 10, as shown in FIGS. 4(E) and 4(F).

Thereafter, the formation steps of a conducting layer 11 for a base electrode will be described below with reference to FIGS. 4(G) to 4(J).

First, a conducting layer 11 is overcoated such that its height is higher than that of the polysilicon masking layer 7, and then the overcoated portion of the conducting film 11 is firstly removed by chemically-mechanically polishing using the second masking layer 7 as a stopper, that is, the overcoated portion of the conducting film is polished such that the surface of the conducting film is planarized with that of the second masking layer 7, as shown in FIG. 4(G).

Thereafter, the conducting film 11 is further etched using the first masking layer 6 as an etching stopper, wherein the conducting film 11 and the polysilicon masking layer 7 are also etched the same as the etched thickness of the conducting film 11, as shown in FIG. 4(H).

Finally, the conducting film 11 is further etched using the pad oxide 5 as an etching stopper, to thereby form a conducting layer 11 for base electrode on the second insulating film 10 such that its height is equal to the collector film 4, as shown in FIG. 4 (I). Then, the pad oxide 5 and the first masking layer 6 are removed, as shown in FIG. 4 (J). At this time, the conducting layer 11 for the base electrode is a P$^+$-type polysilicon, a poly-SiGe, or a poly-Ge which is doped by either an in-situ doping or a dopant implantation.

Referring now to FIG. 4(K), multi-layer base materials are deposited on the resultant structure. A single-crystalline intrinsic base 12 is formed on the surface of the single-crystalline collector films 3 and 4, and a poly-crystalline extrinsic base 12-1 is formed on the polysilicon conducting layer 11, simultaneously. In order to prevent the degradation of the performance of the element due to the occurrence of a parasitic electric potential, the multi-layer base is comprised of Si/undoped SiGe/doped SiGe/Si heterojunction structure from the bottom to the top.

Referring to FIG. 4(L), a third insulating film 13 is deposited on the base regions 12 and 12-1, and then the intrinsic base 12 is opened by etching the third insulating film 13 using a photoresist pattern defining an emitter region as a mask. Thereafter, an emitter layer 14 is formed by depositing on the surface of the exposed intrinsic base 12 and a portion of the third insulating film 13. The single crystalline emitter layer 14 is then doped by either an in-situ doping or an ion implantation followed by the heat treatment.

Referring now to FIG. 4(M), a spacer 16 is formed at both sidewalls of the emitter layer 14 and on the third insulating film 13.

Referring to FIG. 4(N), a metal or a metallic silicide layer 17, such as a titanium silicide is selectively formed on the emitter layer 14 and the base electrode 12-1 in order to decrease the parasitic resistance of base and emitter.

Referring to FIG. 4(0), a non-active region of the transistor, such as a portion of metallic silicide 17, the extrinsic base 12-1, the conducting layer 11 and the collector films 3 are sequentialy etched using a photoresist mask defining an active region as a mask. Thereafter, a passivation insulating film 18 is deposited on the entire surface of the resultant structure.

Referring to FIG. 4(P), metallic interconnections 19 are formed through contact windows exposing the emitter silicide 19, the base silicide 17 and the buried collector 2.

Figure 5A:
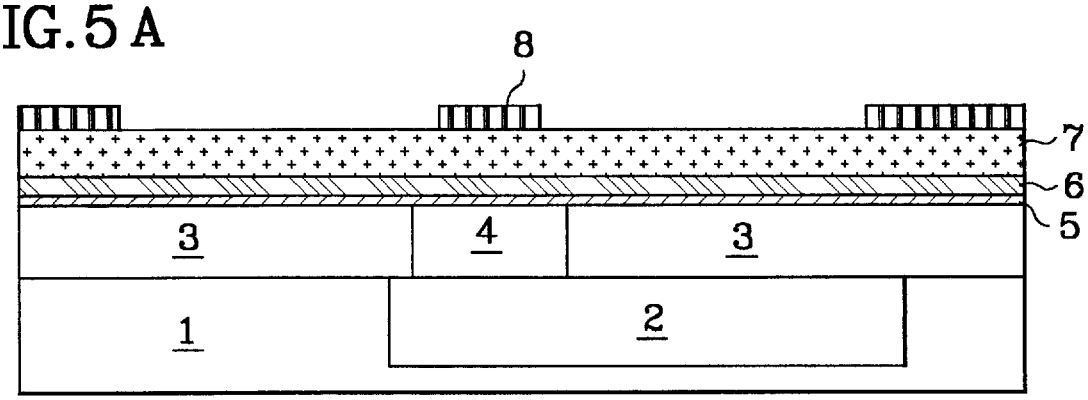
FIGS. 5(A) to 5(P) exhibit schematic cross-sectional views setting forth the manufacturing steps for the super self-aligned bipolar transistor in accordance with other preferred embodiments of the present invention.
Figure 5B:
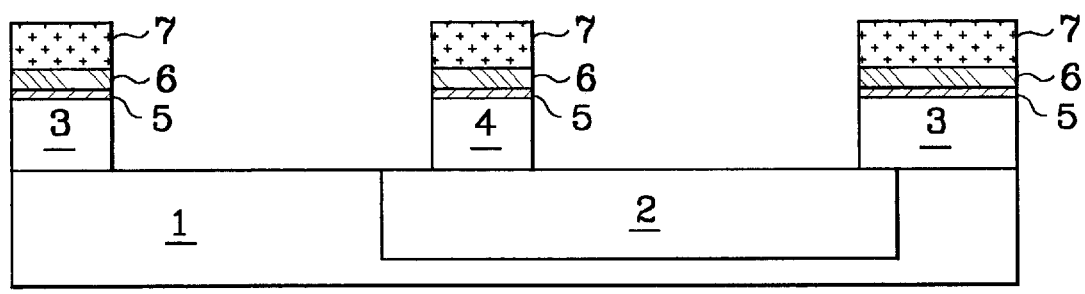
Figure 5C:
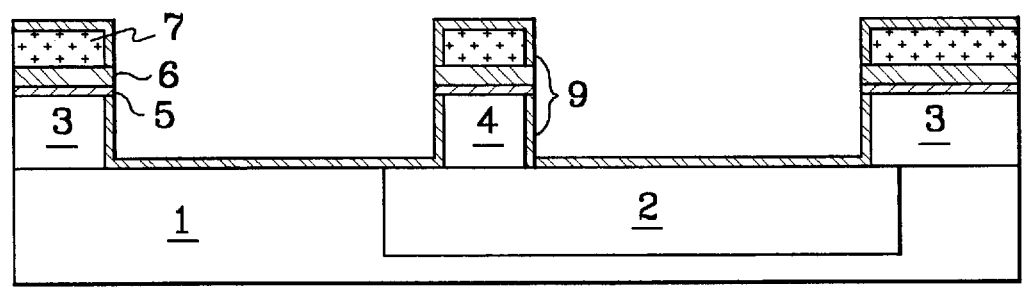
Figure 5D:
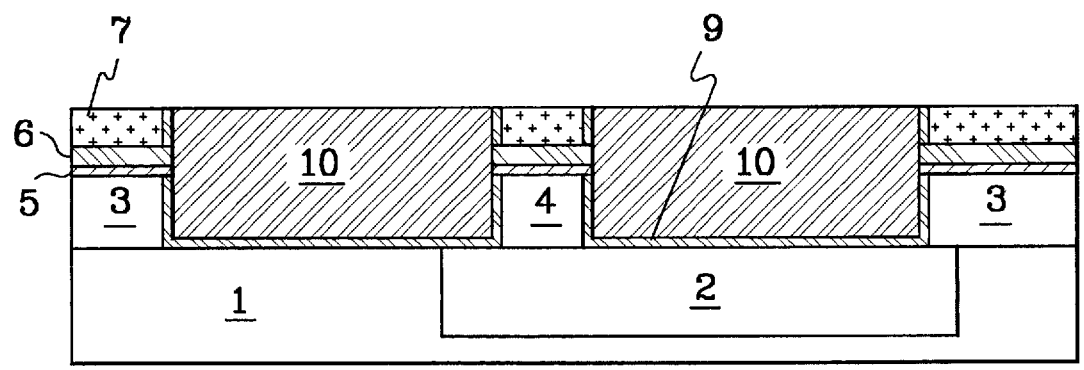
Figure 5E:
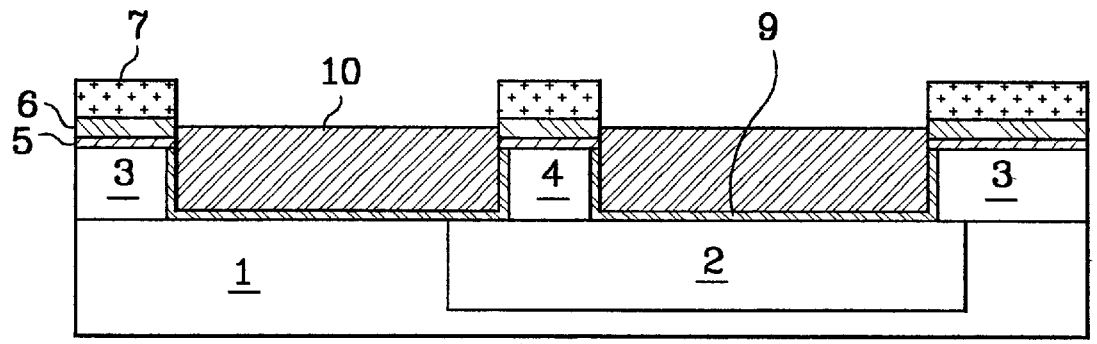
Figure 5F:
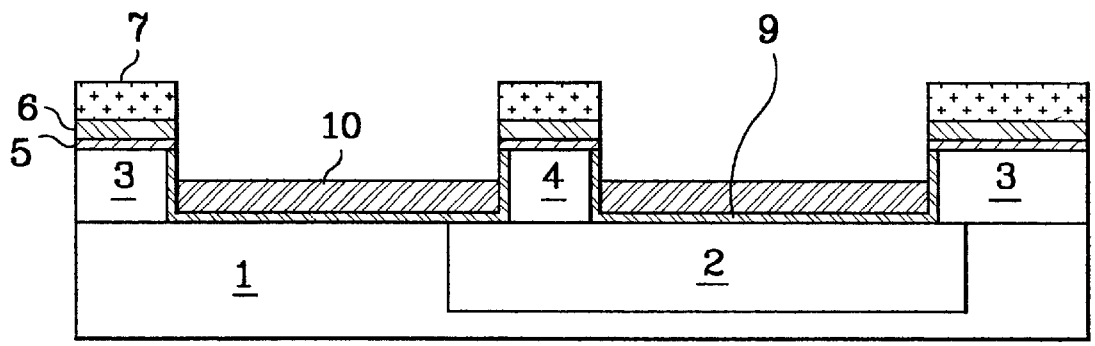
Figure 5G:
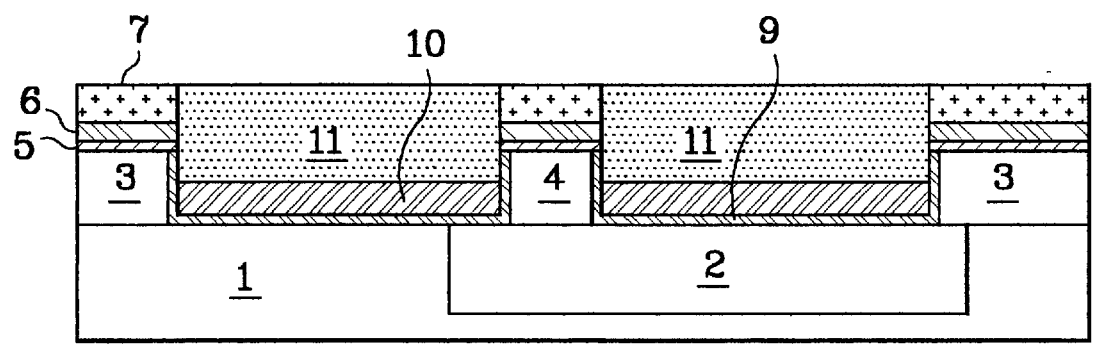
Figure 5H:
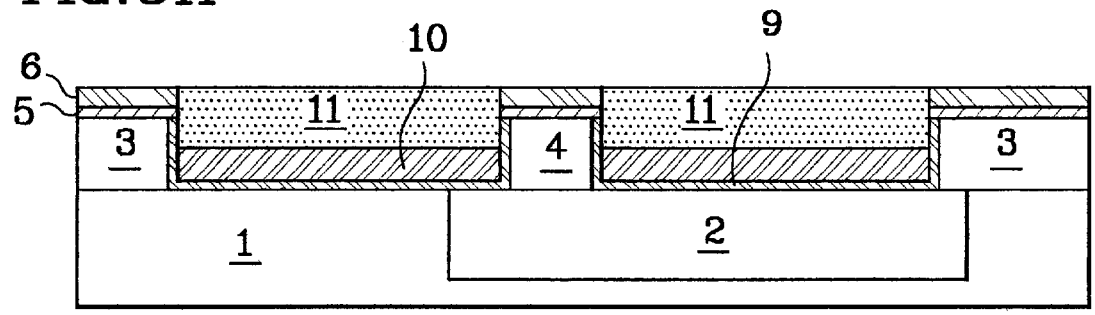
Figure 5I:
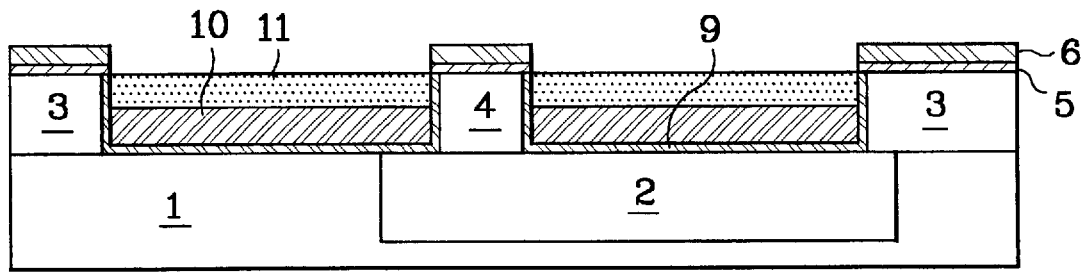
Figure 5J:
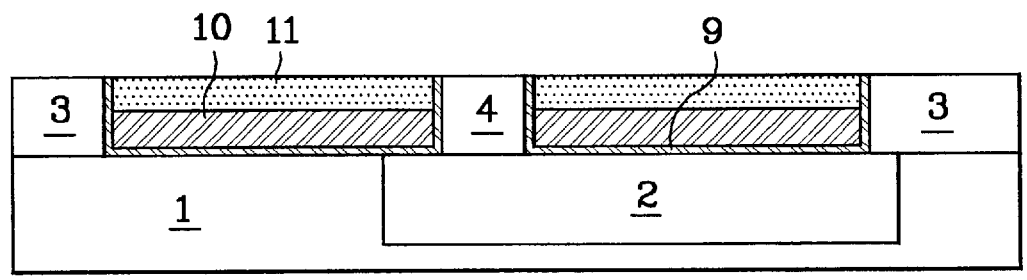
Figure 5K:
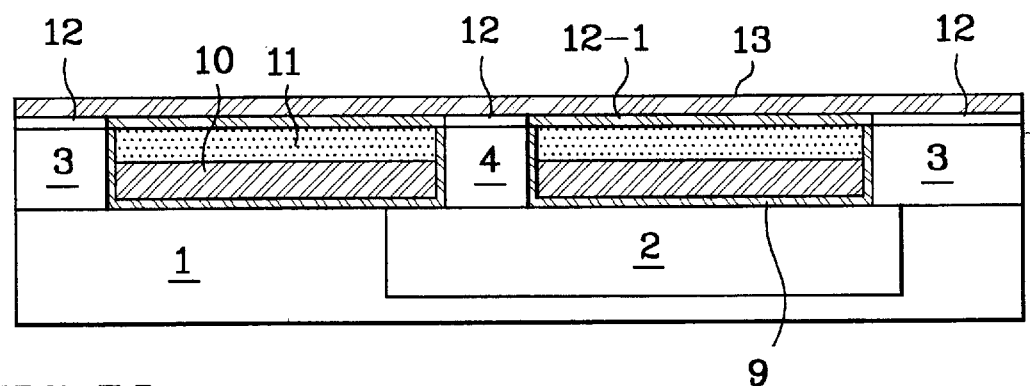
Figure 5L:
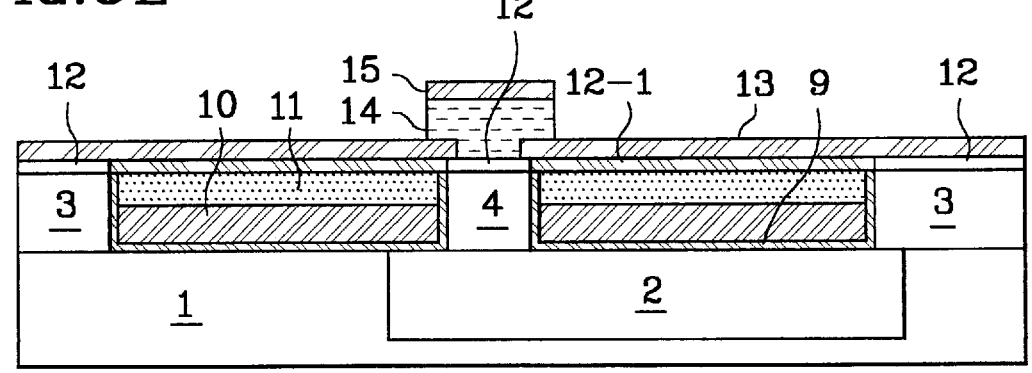
Figure 5M:
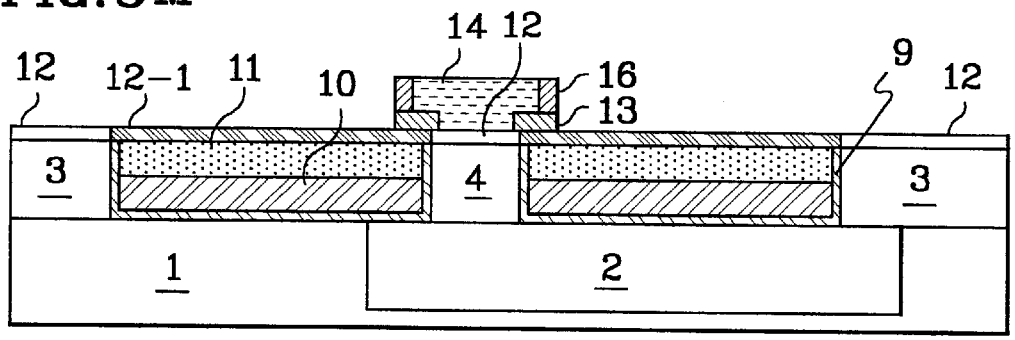
Figure 5N:
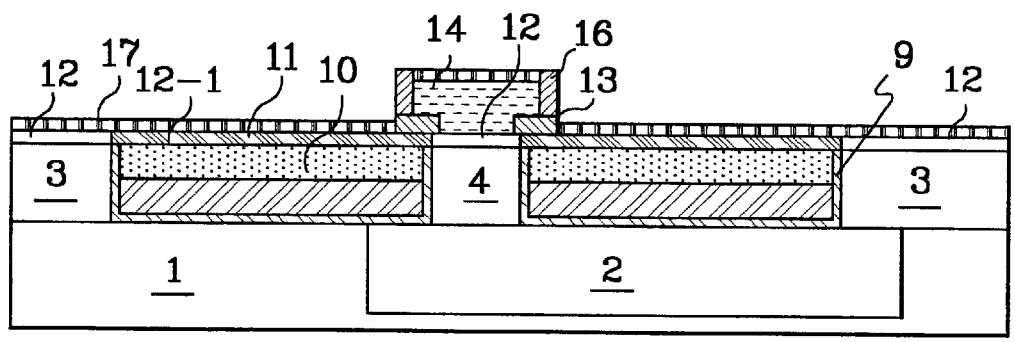
Figure 5O:
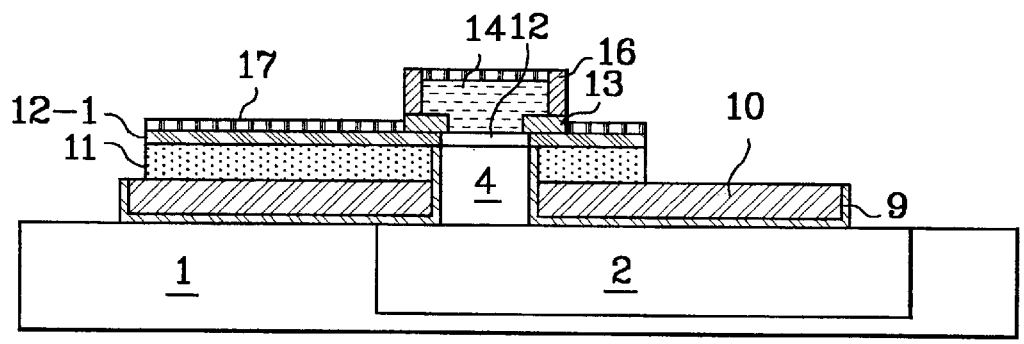
Figure 5P:
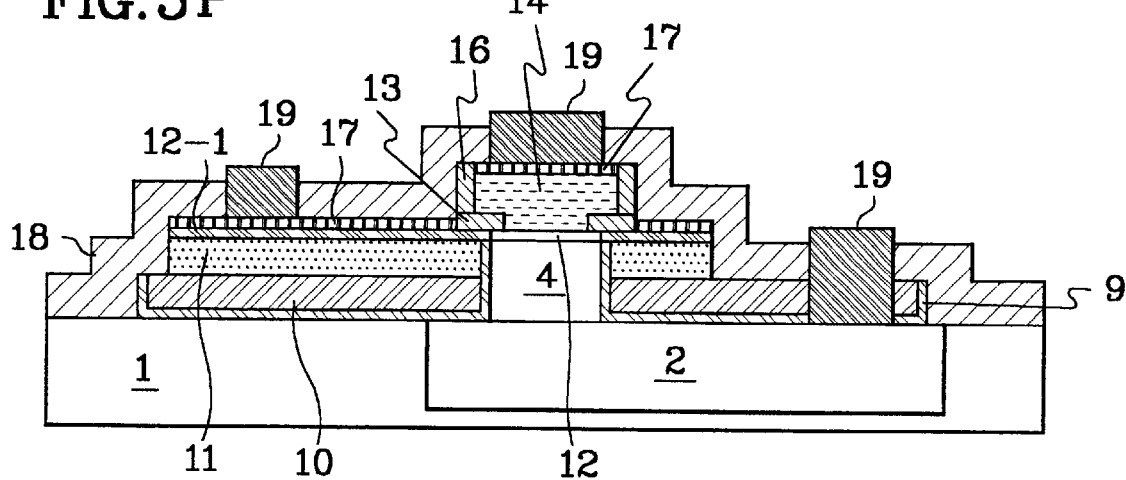

FIGS. 5(A) to 5(P) exhibit schematic cross-sectional views setting forth manufacturing steps for a super self-aligned bipolar transistor according to the second embodiment of the present invention.

All processes of this embodiment are the same as the above-described first embodiment except for the steps shown in FIGS. 5(O) and 5(P). Therefore, descriptions of the same processes will be omitted.

This embodiment is to prevent transmission losses due to the remaining collector thin films 3 in the first embodiment. The transmission losses occur in the remaining collector films 3 since dopants are unintentionally added into the single-crystalline collector films 3.

In order to prevent the transmission loss, this embodiment further comprises the step of removing the remaining collector films 3 to expose the surface of the substrate 1, as shown in FIG. 5(O). As a result, the passivation insulating film 18 is directly connected to the substrate 1, as shown in FIG. 5(P), thereby decreasing the transmission loss of the transistor.

Figure 6A:
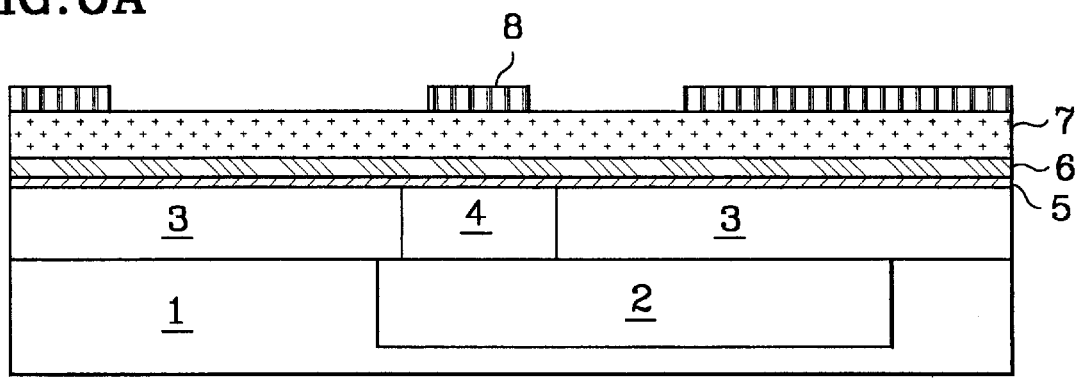
FIGS. 6(A) to 6(P) exhibit schematic cross-sectional views setting forth the manufacturing steps for the super self-aligned bipolar transistor in accordance with other preferred embodiments of the present invention.
Figure 6B:
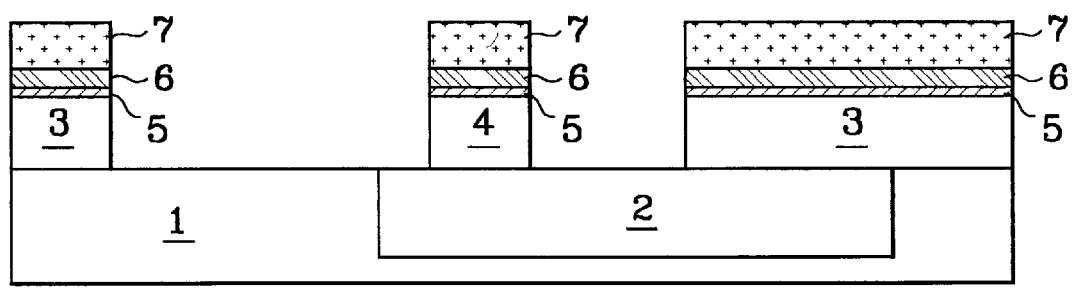
Figure 6C:
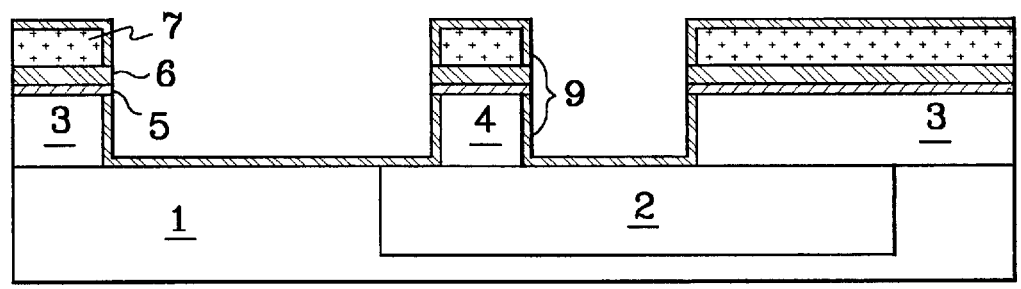
Figure 6D:
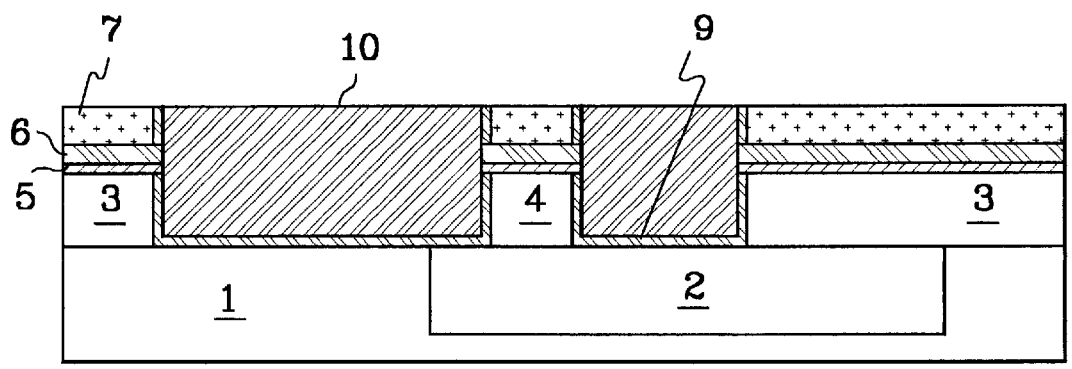
Figure 6E:
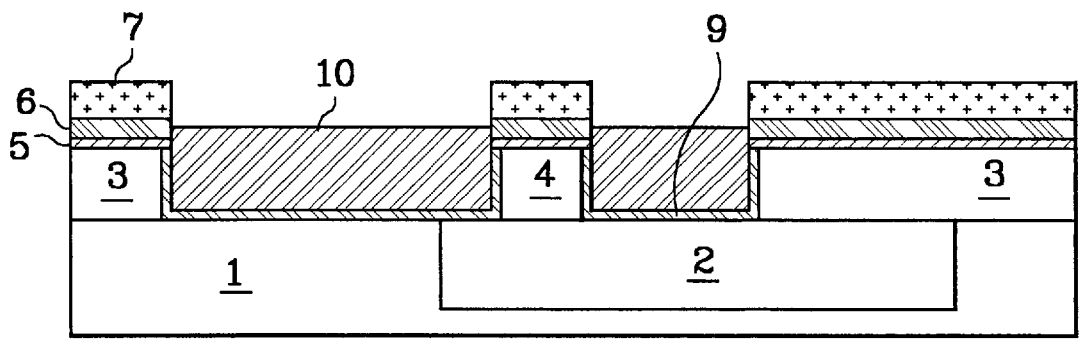
Figure 6F:
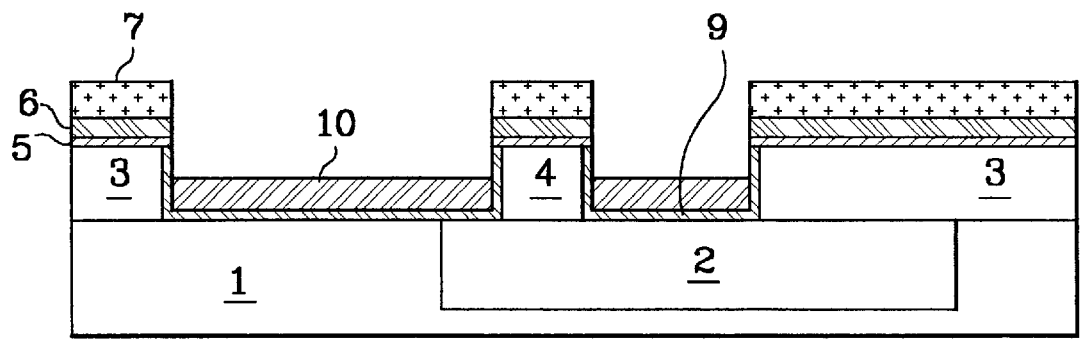
Figure 6G:
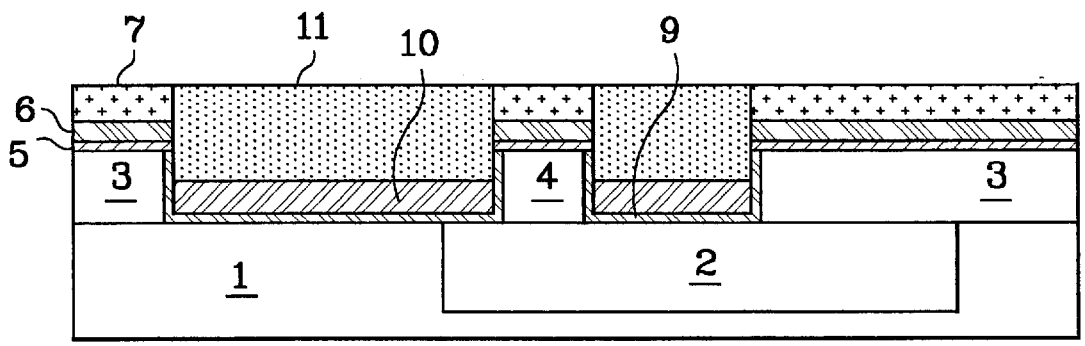
Figure 6H:
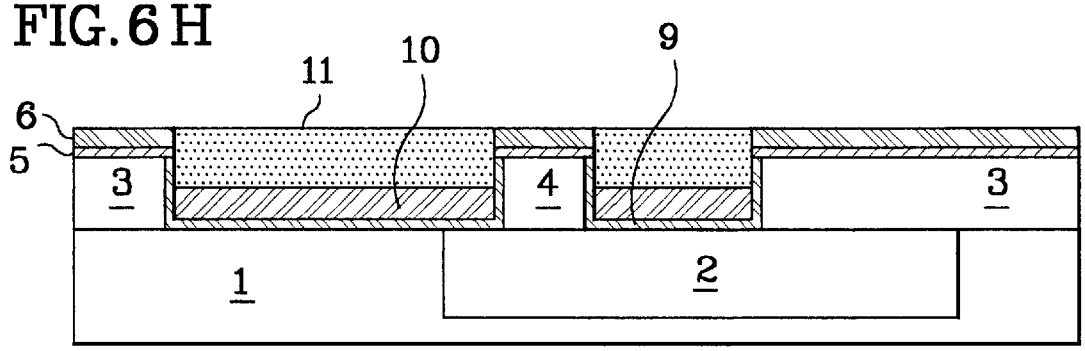
Figure 6I:
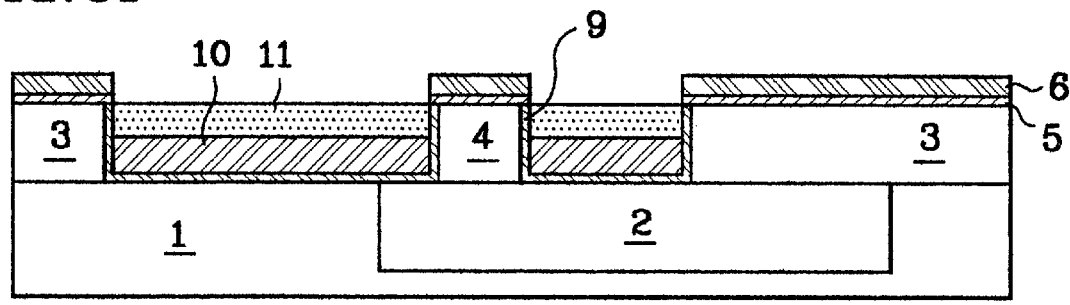
Figure 6J:
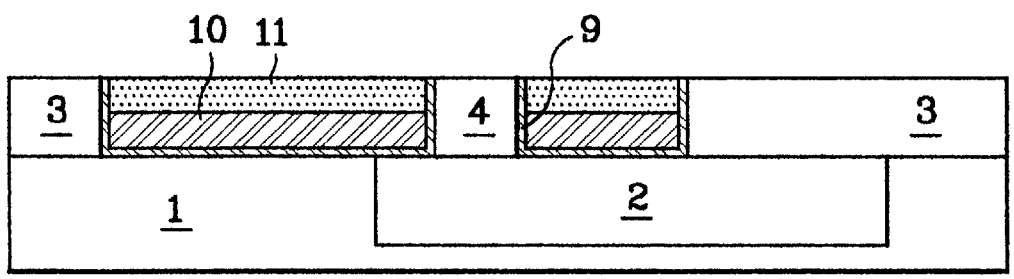
Figure 6K:
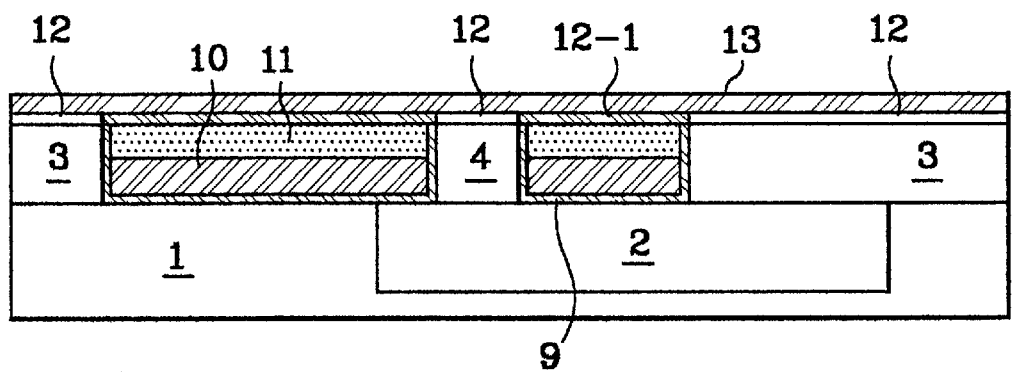
Figure 6L:
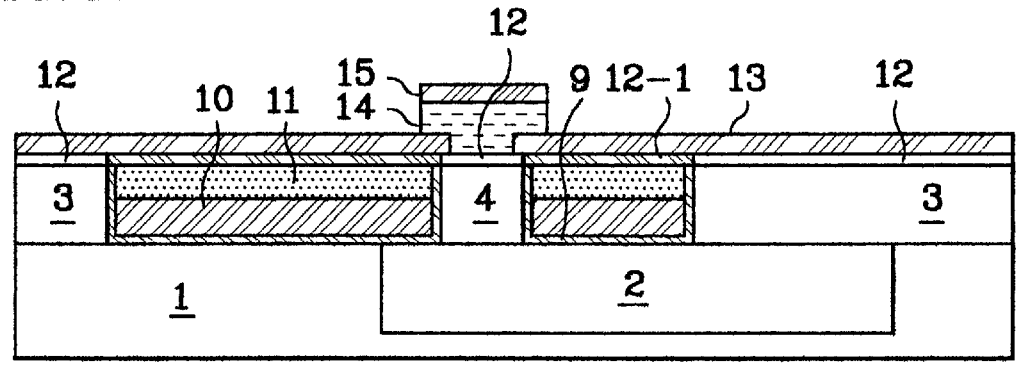
Figure 6M:
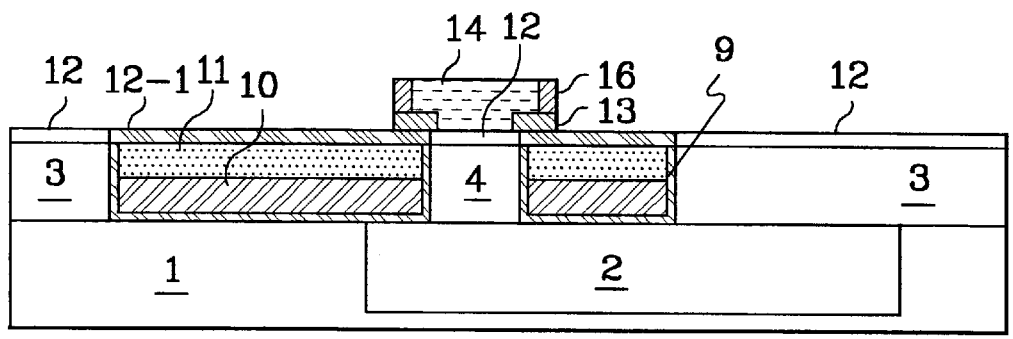
Figure 6N:
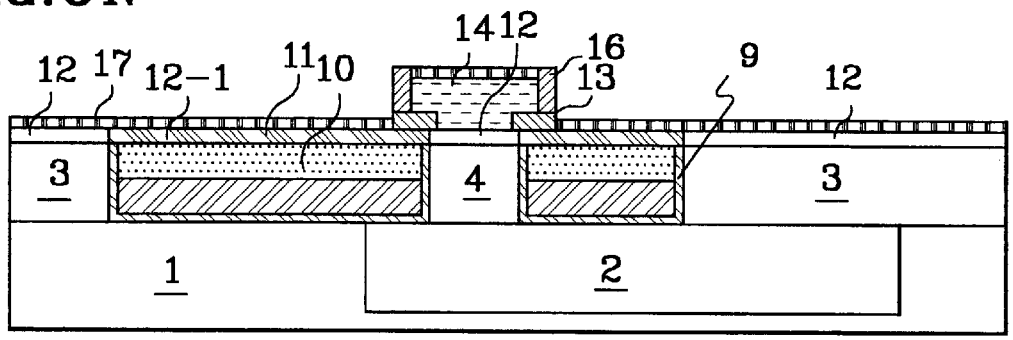
Figure 6O:
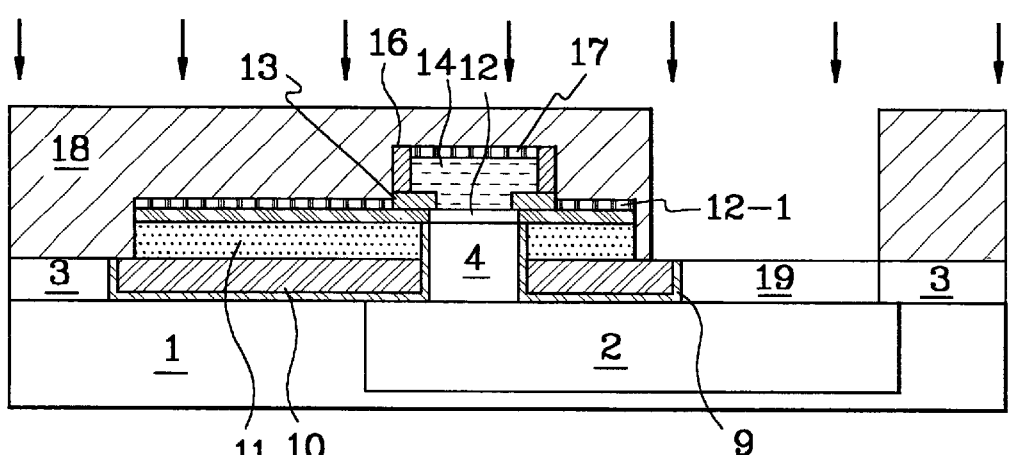
Figure 6P:
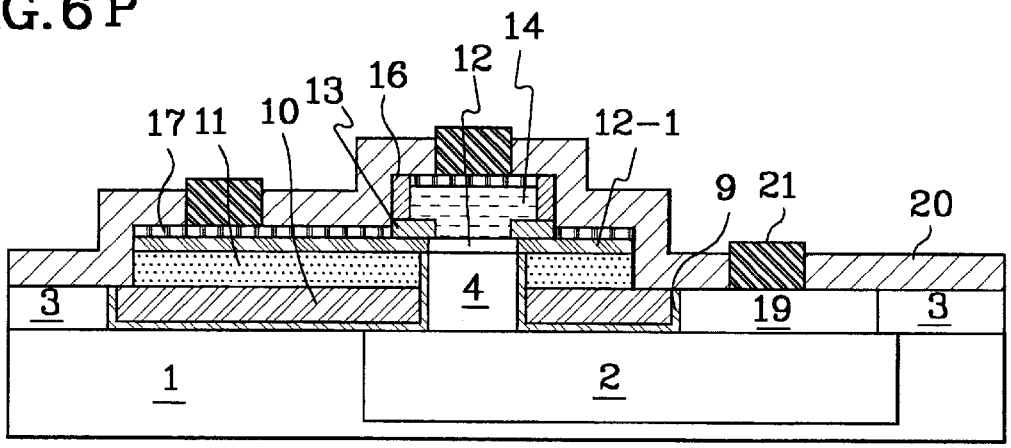

FIGS. 6(A) to 6(P) exhibit schematic cross-sectional views setting forth manufacturing steps for a super self-aligned bipolar transistor according to the third embodiment of the present invention.

Likewise, all processes of this embodiment are the same as the above-described first embodiment except for the steps shown in FIGS. 6(O) and 6(P). Therefore, descriptions of the same processes will be omitted.

The third embodiment of this invention is to improve the step-coverage of the metallic interconnections. Referring to FIG. 6(O), before depositing the passivation insulating film 20, this embodiment further comprises the step of forming a collector sinker 19 by implanting dopants into a portion of remaining collector films 3 using a photoresist pattern 18 as an ion-implanting mask. As a result, the collector interconnection 21 is directly connected with the collector sinker 19, thereby decreasing the step-coverage of the metal wire.

As mentioned above, the present invention has advantages in that an operating speed of the bipolar transistor can be increased using a Si/SiGe heterojunction thin film structure, a parasitic capacity and a parasitic resistance of elements are reduced, and an element is miniaturized, to thereby achieve high speed, high integration and low power consumption.

Furthermore, the invention provides a super self-aligned heterojunction bipolar transistor and method thereof which is capable of miniaturizing an element, simplifying the process steps thereof without using a trench isolation process and a sophisticated selective epitaxial growing (SEG) process.

While the present invention has been described with respect to certain preferred embodiments only, other modifications and variations may be made without departing from the scope of the present invention as set forth in the following claims.

What is claimed is:

1. A super self-aligned heterojunction bipolar transistor comprising:

a semiconductor substrate having a buried collector;

a first insulating film formed on the buried collector;

a second insulating film formed on the first insulating film;

a conducting layer for a base electrode formed on the second insulating film, the first insulating film being formed at sidewalls of the second insulating film and the conducting layer;

a collector surrounded by the first insulating film, and formed on the buried collector in an active region of the transistor defined by patterning the conducting layer, the first insulating film, and the second insulating film, the first insulating film separating the conducting layer and the collector;

a multi-layer intrinsic base formed on the collector;

a multi-layer extrinsic base formed on the conducting layer and the first insulating film;

an emitter formed on the intrinsic base;

a spacer formed at both sidewalls of the emitter;

a third insulating film formed under the spacer so that the emitter is separated from the conducting layer for the base electrode;

a metallic silicide thin film formed on the base electrode and an emitter electrode;

a fourth insulating layer formed on an entire surface of the above semi-finished structure; and metallic interconnections formed on the base electrode, the emitter electrode, and the buried collector.

2. The bipolar transistor according to claim 1, wherein the semiconductor substrate is composed of a single silicon substrate, a heterojunction substrate being made of Si/SeGe/Ge, or a heterojunction substrate being made of Si/diamond/Si or Ge from the bottom to the top.

3. The bipolar transistor according to claim 1, wherein the second insulating film is formed by either a single layer of a silicon nitride or double layer made of a silicon oxide and a silicon nitride.

4. The bipolar transistor according to claim 1, wherein the conducting layer for the base electrode is a polysilicon, a poly-SiGe, or a poly-Ge which is doped by either an in-situ doping or a dopant implantation.

5. The bipolar transistor according to claim 1, wherein said collector is made of either a single crystalline silicon or a germanium.

6. The bipolar transistor according to claim 1, wherein the multi-layer intrinsic and extrinsic base are formed by a double layer consisting of Si/SiGe.

7. The bipolar transistor according to claim 1, further comprising a collector sinker between said collector interconnection and said buried collector.

8. The bipolar transistor according to claim 1, wherein each of the multi-layer intrinsic and extrinsic bases is comprised of Si/undoped SiGe/doped SiGe/Si heterojunction structure.

* * * * *